United States Patent
Goh et al.

(10) Patent No.: US 10,317,938 B2
(45) Date of Patent: Jun. 11, 2019

(54) APPARATUS UTILIZING COMPUTER ON PACKAGE CONSTRUCTION

(71) Applicant: Intel Corporation, Santa Clara, CA (US)

(72) Inventors: Eng Huat Goh, Ayer Itam (MY); Khai Ern See, Batu Gajah (MY); Damien Weng Kong Chong, Kampung Jawa (MY); Min Suet Lim, Bayan Lepas (MY); Ping Ping Ooi, Butterworth (MY); Chu Aun Lim, Bayan Lepas (MY); Jimmy Huat Since Huang, Penang (MY); Poh Tat Oh, Bayan Lepas (MY); Teong Keat Beh, Bayan Lepas (MY); Jackson Chung Peng Kong, Tanjung Tokong (MY); Fern Nee Tan, Putra Place (MY); Jenn Chuan Cheng, Bayan Lepas (MY)

(73) Assignee: INTEL CORPORATION, Santa Clara, CA (US)

(*) Notice: Subject to any disclaimer, the term of this patent is extended or adjusted under 35 U.S.C. 154(b) by 0 days.

(21) Appl. No.: 14/604,531

(22) Filed: Jan. 23, 2015

(65) Prior Publication Data
US 2016/0216731 A1    Jul. 28, 2016

(51) Int. Cl.
G06F 1/16      (2006.01)
H05K 1/18      (2006.01)
G06F 1/18      (2006.01)
G06F 13/38     (2006.01)

(52) U.S. Cl.
CPC ............ *G06F 1/163* (2013.01); *G06F 1/1656* (2013.01); *G06F 1/187* (2013.01); *G06F 13/38* (2013.01)

(58) Field of Classification Search
CPC .......... G06F 1/163; G06F 1/187; G06F 13/38; G06F 1/1656; H05K 1/18; H05K 2201/10522; H05K 2201/10159
USPC ........................................................ 361/752
See application file for complete search history.

(56) References Cited

U.S. PATENT DOCUMENTS

| | | | | |
|---|---|---|---|---|
| 5,581,712 A * | 12/1996 | Herrman | ............. | G06F 13/4072 710/302 |
| 6,366,974 B1 * | 4/2002 | Kung | ................... | H01R 13/514 439/638 |
| 8,776,037 B2 * | 7/2014 | Gee | ......................... | G06F 8/65 717/168 |
| 2006/0101176 A1 * | 5/2006 | Eric | ..................... | G06F 1/1613 710/62 |
| 2006/0164891 A1 | 7/2006 | Mills et al. | | |

(Continued)

OTHER PUBLICATIONS

International Search Report and Written Opinion for PCT Application No. US 15/056,650 dated Feb. 3, 2016, 12 pages.
(Continued)

*Primary Examiner* — Rockshana D Chowdhury
(74) *Attorney, Agent, or Firm* — Womble Bond Dickinson (US) LLP

(57) ABSTRACT

Embodiments are generally directed to an apparatus utilizing computer on package construction. An embodiment of a computer includes a substrate; one or more semiconductor devices, the one or more semiconductor devices being direct chip attached to the substrate, the one or more semiconductor devices including a central processing unit (CPU); and one or more additional components installed on the substrate, wherein the computer excludes I/O components.

22 Claims, 10 Drawing Sheets

(56) References Cited

U.S. PATENT DOCUMENTS

| | | | |
|---|---|---|---|
| 2007/0076369 A1 | 4/2007 | Chen et al. | |
| 2009/0200367 A1* | 8/2009 | Arnouse | G06F 15/02 |
| | | | 235/375 |
| 2011/0141712 A1* | 6/2011 | You | H05K 1/11 |
| | | | 361/782 |
| 2012/0153982 A1* | 6/2012 | Lee | G01R 31/31908 |
| | | | 324/756.03 |
| 2012/0192265 A1 | 7/2012 | Arnouse | |
| 2013/0254705 A1* | 9/2013 | Mooring | G06F 3/0488 |
| | | | 715/784 |
| 2013/0283070 A1* | 10/2013 | Jaussi | G06F 1/26 |
| | | | 713/300 |
| 2014/0002989 A1* | 1/2014 | Ahuja | G06F 1/20 |
| | | | 361/679.54 |
| 2014/0002994 A1* | 1/2014 | Walczyk | F28F 9/007 |
| | | | 361/710 |
| 2014/0089688 A1* | 3/2014 | Man | G06F 1/3206 |
| | | | 713/300 |
| 2014/0237142 A1* | 8/2014 | Jaussi | G06F 13/385 |
| | | | 710/12 |
| 2015/0021754 A1* | 1/2015 | Lin | H01L 23/5389 |
| | | | 257/712 |

OTHER PUBLICATIONS

First Office Action and Search Report (+English Translation of Search Report) in Taiwan Application No. 104140942 dated Mar. 1, 2017, 10 pages.

International Preliminary Report on Patentability for International Appln. No. PCT/US2015/056650, dated Aug. 3, 2017, 9 pgs.

* cited by examiner

APPARATUS UTILIZING COMPUTER ON PACKAGE CONSTRUCTION

TECHNICAL FIELD

Embodiments described herein generally relate to the field of electronic devices and, more particularly, to an apparatus utilizing computer on package construction.

BACKGROUND

Wearable electronic devices are being developed to provide greater functionality, and it is expected such devices will become increasingly common as the devices improve. In addition, devices using Internet of Things (IoT) technology may increasingly provide networked functionality for many different types of products in personal and business use.

However, wearable electronic and IoT devices lack the computing power that can be provided by smartphones, tablet computers, and other mobile computing devices. For this reason, the devices often need to rely upon other larger devices for processing, which can limit the convenience and usefulness of the wearable and networked electronics.

BRIEF DESCRIPTION OF THE DRAWINGS

Embodiments described here are illustrated by way of example, and not by way of limitation, in the figures of the accompanying drawings in which like reference numerals refer to similar elements.

DETAILED DESCRIPTION

Figure 1:
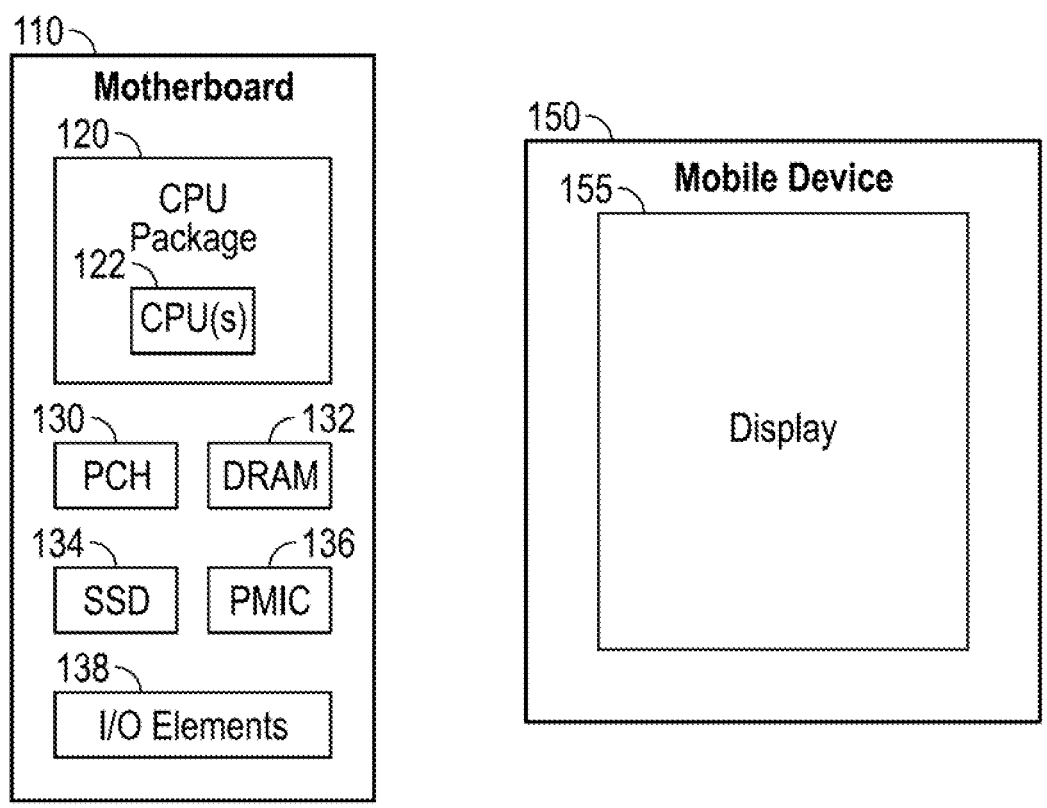
FIG. 1 illustrates a computer motherboard and mobile device.

Embodiments described herein are generally directed to an apparatus utilizing computer on package construction.

For the purposes of this description:

"Wearable electronics" means an electronic device that is integrated at least in part into an item that may be worn by a user. Wearable electronics may include electronic devices that operate independently as well as electronic devices that operate in conjunction with a second electronic device, such as a mobile device.

"Mobile device" means a smartphone, smartwatch, tablet computer, phablet (referring to a device that has features of both a smartphone and a tablet computer), handheld computer, mobile Internet device, or other mobile apparatus that includes processing ability and communication ability.

Mobile devices and wearable devices are increasingly being developed and used for complex functions. Further, Internet of Things (IoT) devices are being developed for many different types of personal and business produces, wherein the IoT provides for interconnection of embedded computer devices within the Internet. However, these types of functions can require high levels of computer processing, which is difficult to provide in a small device.

High performance computers in conventional operation include a printed circuit board (PCB) referred to as a motherboard, with the motherboard including a CPU (central processing unit) package. The CPU package contains a substrate on to which the CPU and connected elements are installed, the CPU package being mounted on the motherboard. However, modern motherboards for high performance computers, while having become significantly smaller in recent developments, are still too large to be used in small mobile devices.

In some embodiments, a computer is constructed utilizing chip on package construction in which a package substrate is constructed including only core computer components directly attached to the substrate. In some embodiments, the construction of the computer, referred to herein as a computer on package, system on package, or PC on package, excludes the use of a motherboard, thereby eliminating the large printed circuit board that is required in conventional high performance computing platforms.

In some embodiments, the computer on package excludes I/O (input-output, referring to communication between the computer and external systems) components, which are bulky and may be large in number if numerous different types of interfaces are to be supported. In some embodiments, in contrast to conventional computers, a computer on package is structured to be paired with multiple different I/O boards, where each I/O board may be designed and structured for a particular usage. In some embodiments, the computer on package may be used to provide high performance computing in devices such as a mobile device, a wearable device, or IoT (Internet of Things) device while maintaining a small size factor.

In some embodiments, a computer on package may be structured to be a small PC with minimal I/O and display capability, which may be referred to as a credit card size computer (which may be larger or smaller than an actual credit card), a PC on pocket (when used in a mobile operation), or other similar terms.

Current wearable electronic devices, such as Google Glass® or Samsung Galaxy Gear Smartwatch®, still lack computing power compared to a phone or tablet. In order to enrich the wearable computing experience, the conventional devices can in some case be connected to computing hubs such as smartphones, phablets, or tablet computers. However, these devices are not designed to deliver the performance and storage of a typical computing hub. In some embodiments, a system is improved by introducing a high performance, small form factor computing hub to provide processing for external devices linked (wirelessly or by wired connection) with the computing hub, wherein external devices may include wearable electronic devices and IoT devices, and for other computing applications, wherein the computing hub doesn't include, for example, a display screen but instead relies on the interfaces from the linked external devices devices. A particular implementation of a computing hub can fit into pockets, or be embedded into clothing.

FIG. 1 illustrates a computer motherboard and mobile device. As illustrated, a conventional computer motherboard 110 may include a CPU package 120, including one or more CPUs 122 and related electronics, as well as other required components, including a platform controller hub (PCH) 130, memory such as dynamic random access memory (DRAM) 132, additional data storage such as a solid state drive (SSD) 134 or other data storage technology, a power management integrated circuit (PMIC) 136 or other device or subsystem for power management of the computer, and various I/O components.

However, even when utilizing a modern, advanced design, such a computer motherboard 110 will be considerably larger than most mobile devices 150, which is illustrated in FIG. 1 to be a smartphone or phablet with display 155. In current smartphone and phablet structure, the PCB (motherboard) housing the CPU, DRAM, SSD, and I/O components cannot be more than approximately 1800 mm$^2$ in size. However, high performance computing systems using conventional offerings are too large for this usage.

In some embodiments, a computer on package system addresses the challenges of fitting a high performance computing power platform into small devices such as a computing hub, phablet, smartphone, for use in connection with external linked devices, such as wearable electronics and IoT devices, and for other purposes. In some embodiments, the motherboard 110 is eliminated from the computer, and a PC on package is constructed, thereby enabling significant reduction in the overall platform real estate. Such computer construction may be utilized to provide new products, including providing an opportunity for manufacturers to produce and sell a new core platform for the fast growing mobile segment, along with other potentially new segments requiring high computing density.

Figure 2A:
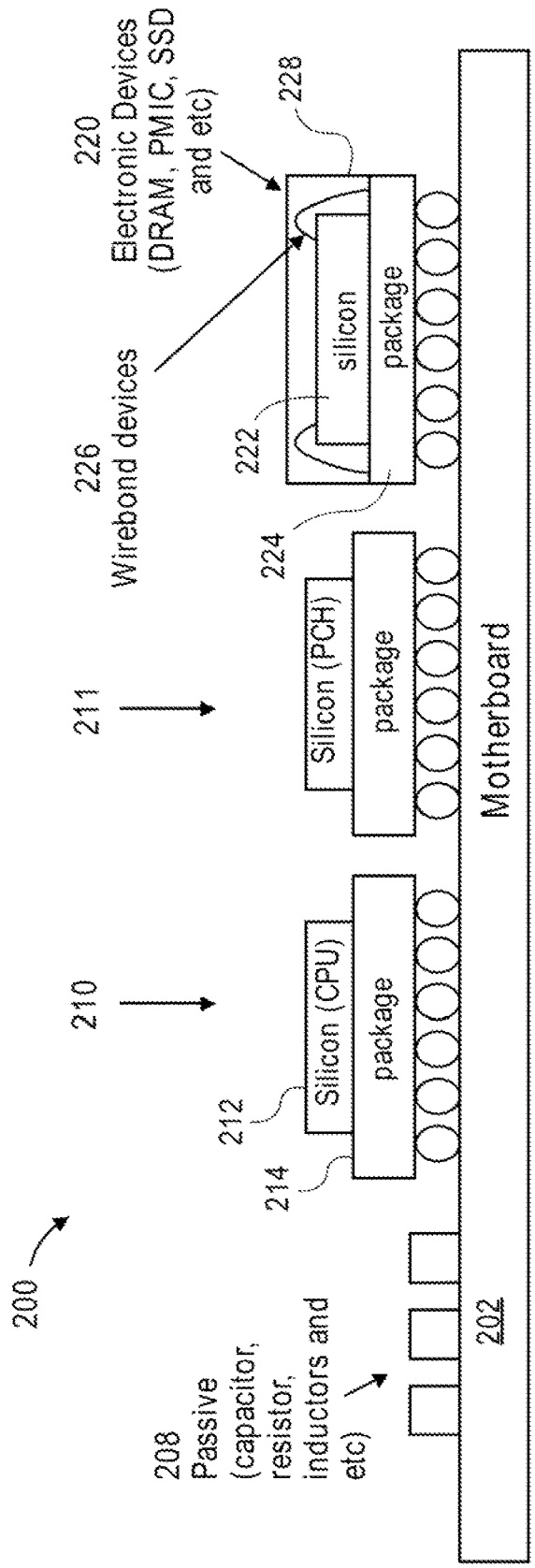
FIG. 2A illustrates elements of a computer with motherboard construction.

FIG. 2A illustrates elements of a computer with motherboard construction. As illustrated in FIG. 2A, a computer 200 may include a motherboard 202 to which is attached multiple devices, wherein the devices may include passive devices 208, such as capacitors, resisters, inductors, and other passive devices; a CPU package 210 and PCH package, each of which may include silicon 212 (referring to an integrated circuit containing silicon based semiconductors) coupled with a package 214, the CPU package 210 and PCH package 211 being coupled with the motherboard 202. The computer 200 also includes one or more other electronic device packages 220 coupled with the motherboard 202, wherein the electric devices may include DRAM, PMIC, SSD, and other active devices. The electronic devices 220 may include wirebond devices, which may include a silicon IC 222 coupled with a package 224, the silicon 222 being wirebond to the package 224, wherein the silicon may be encased in a molding 228. In this construction, the motherboard will be much larger than the CPU package 210, thus limiting the potential usages for the computer. In addition, numerous other elements are installed in the motherboard, including I/O elements.

Figure 2B:
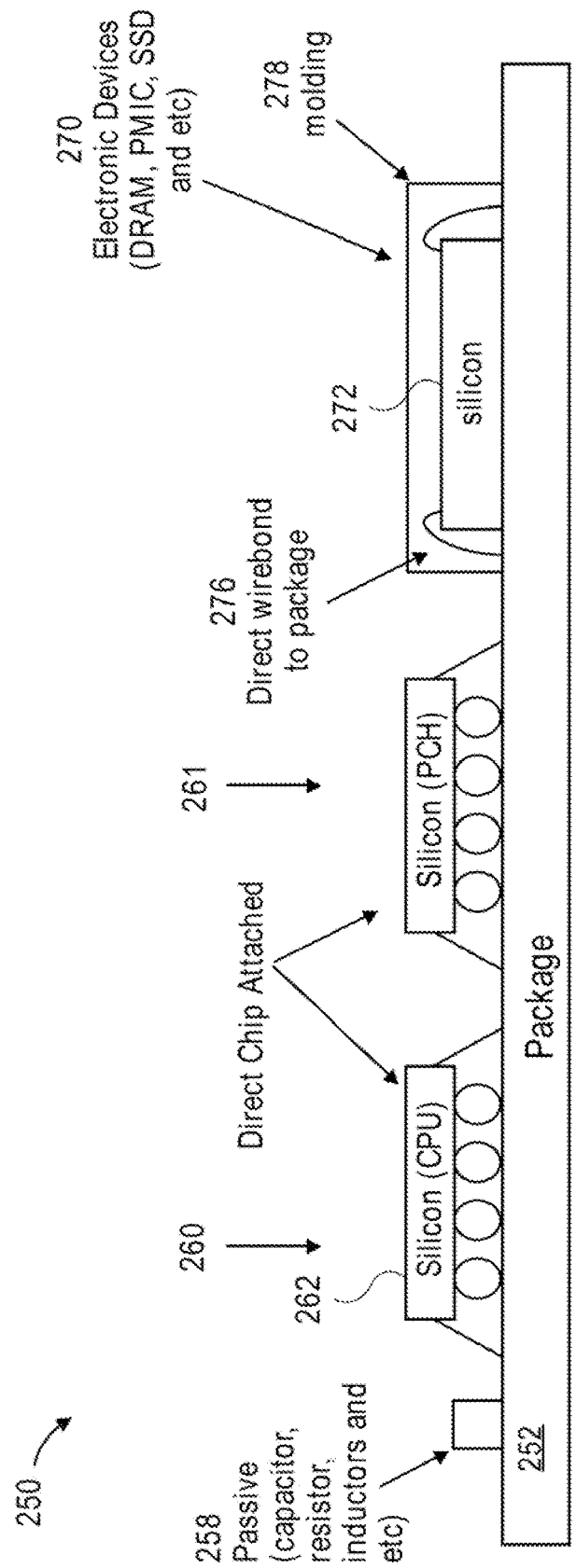
FIG. 2B illustrates elements of a computer on package construction according to an embodiment.

In contrast, FIG. 2B illustrates elements of a computer on package construction according to an embodiment. In some embodiments, a computer (PC platform) 250 is designed and constructed on a package substrate 252, thus eliminating the motherboard PCB. As illustrated, a computer on package 250 includes a package 252 to which is attached multiple devices, wherein the devices may include passive devices 258, such as capacitors, resisters, inductors, and other passive devices; a CPU component 260 and PCH component 261, each of which includes the silicon 262 direct chip attached (DCA) with the package substrate 252 without requiring an additional packaging solution. The computer 250 also includes one or more other electronic devices 270 coupled with the package substrate 252, wherein the electric devices may include DRAM, PMIC, SSD, and other active devices. The electronic devices 270 may include direct wirebond devices 276, which may include a silicon element 272 being directly wirebond to the package substrate 252, where the silicon 272 may be encased in a molding 278. This construction eliminates the real estate required to house the package/substrate on a motherboard, which is typically five to ten times larger than the silicon elements. In addition, the computer on package excludes I/O components, allowing further reduction in the size of the apparatus.

In some embodiments, the use of direct chip attachment of components allows for simplification of power delivery in the computer 250, allowing for significant reduction in HF (high frequency) de-coupling and thus smaller power delivery real estate, including the reduction of passive devices 258 required in the system.

In some embodiments, the computer 250 allows for design partitioning placing only core components (CPU, PCH, PMIC, DRAM, storage, and other core components) on the substrate 252, with the resulting real estate being reducible with the use of package design rules. In contrast, large and bulky I/O connectors, which are body size limited and cannot significantly benefit from fine design rules offered by the substrate 252, are excluded from the computer and placed in a separate PCB, referred to herein as an I/O board.

Figure 3A:
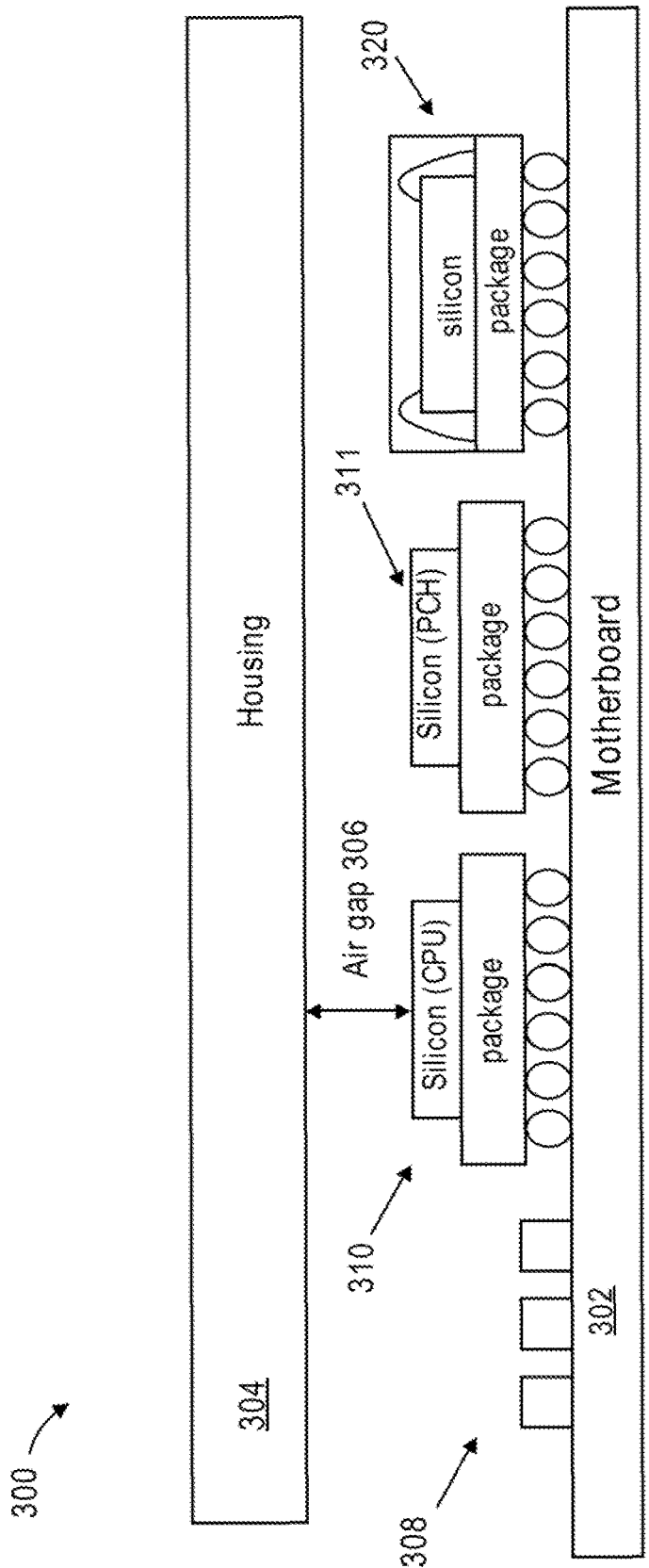
FIG. 3A illustrates a computer with motherboard construction within a housing.

FIG. 3A illustrates a computer with motherboard construction within a housing. As illustrated in FIG. 3A, a computer 300 may include a motherboard 302 within a housing 304. As also illustrated in FIG. 2A, multiple devices are attached to the motherboard, wherein the devices may include passive devices 308, such as capacitors, resisters, inductors, and other passive devices; a CPU package 310; a PCH package 311; and one or more other electronic device packages 320, wherein the electronic devices may include DRAM, PMIC, SSD, and other active devices.

In this construction, there is a particular air gap between the components and the housing 304, such as the air gap 306 between the CPU package 310 and the housing 304. The air gap 306 affects the cooling of the CPU as airflow to cool the CPU is limited by such air gap. As a result, the air gap may limit the performance of the computer 250 if there is excessive heat build up requiring a reduction in processing operation for the CPU.

Figure 3B:
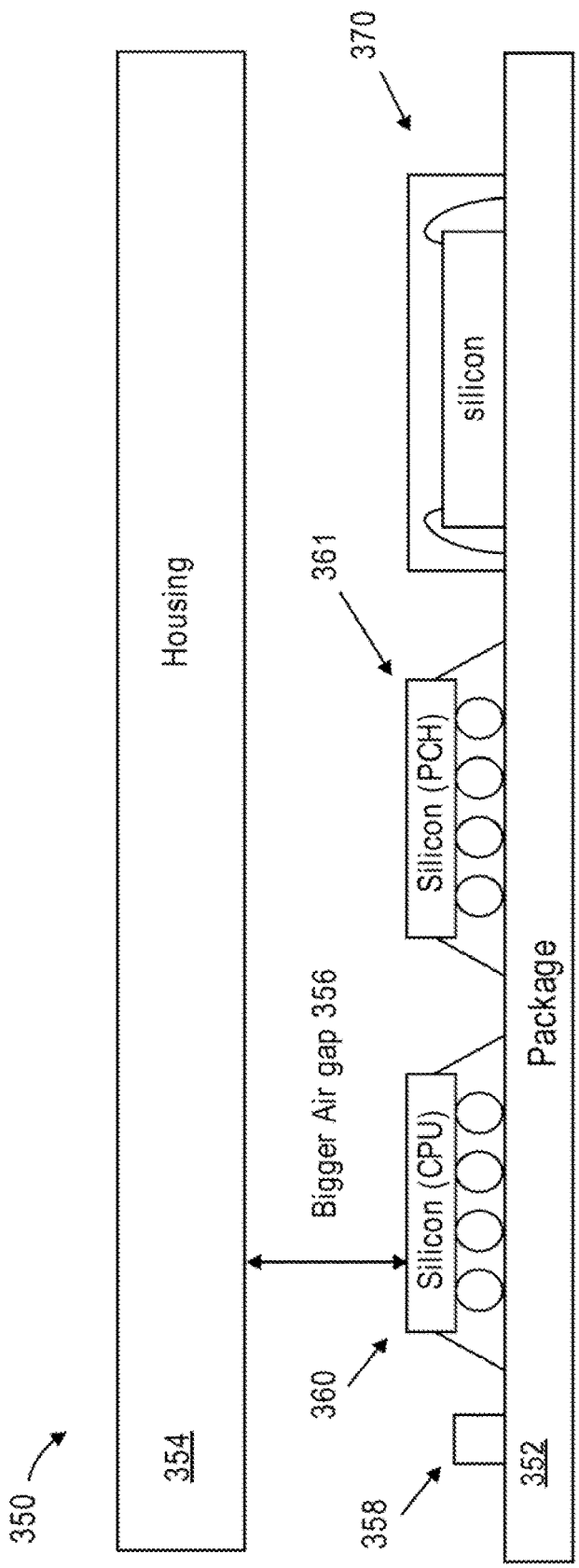
FIG. 3B illustrates a computer on package construction within a housing according to an embodiment.

FIG. 3B illustrates a computer on package construction within a housing according to an embodiment. In some embodiments, a PC platform 350 is designed and constructed on a package substrate 252 within a housing 354. As also illustrated in FIG. 3B, multiple devices are attached to the package substrate, wherein the devices may include passive devices 358, such as capacitors, resisters, inductors, and other passive devices; a CPU component 360 and PCH component 361, the CPU component 360 and PCH component being direct chip attached with the package substrate 352; and one or more other electronic devices 370 attached to the package substrate 352, wherein the electric devices may include DRAM, PMIC, SSD, and other active devices. In some embodiments, the computer on package 350 excludes I/O components.

In some embodiments, direct chip attach provides improved thermal performance in comparison to conventional construction. As illustrated in FIG. 3B, there is an air gap between the components and the housing 354, such as the air gap 356 between the CPU 360 and the housing 354.

However, for a particular computer housing, the air gap 356 is larger than the air gap 306 illustrated in FIG. 3A because of the elimination of the motherboard in the construction of the computer 350 utilizing direct chip attachment of components. The increased air gap 356 may improve cooling of the CPU as increased airflow may be provided for cooling of the CPU. As a result, in some implementations performance of the computer may be improved if excessive heat is removed from the CPU.

Figure 4:
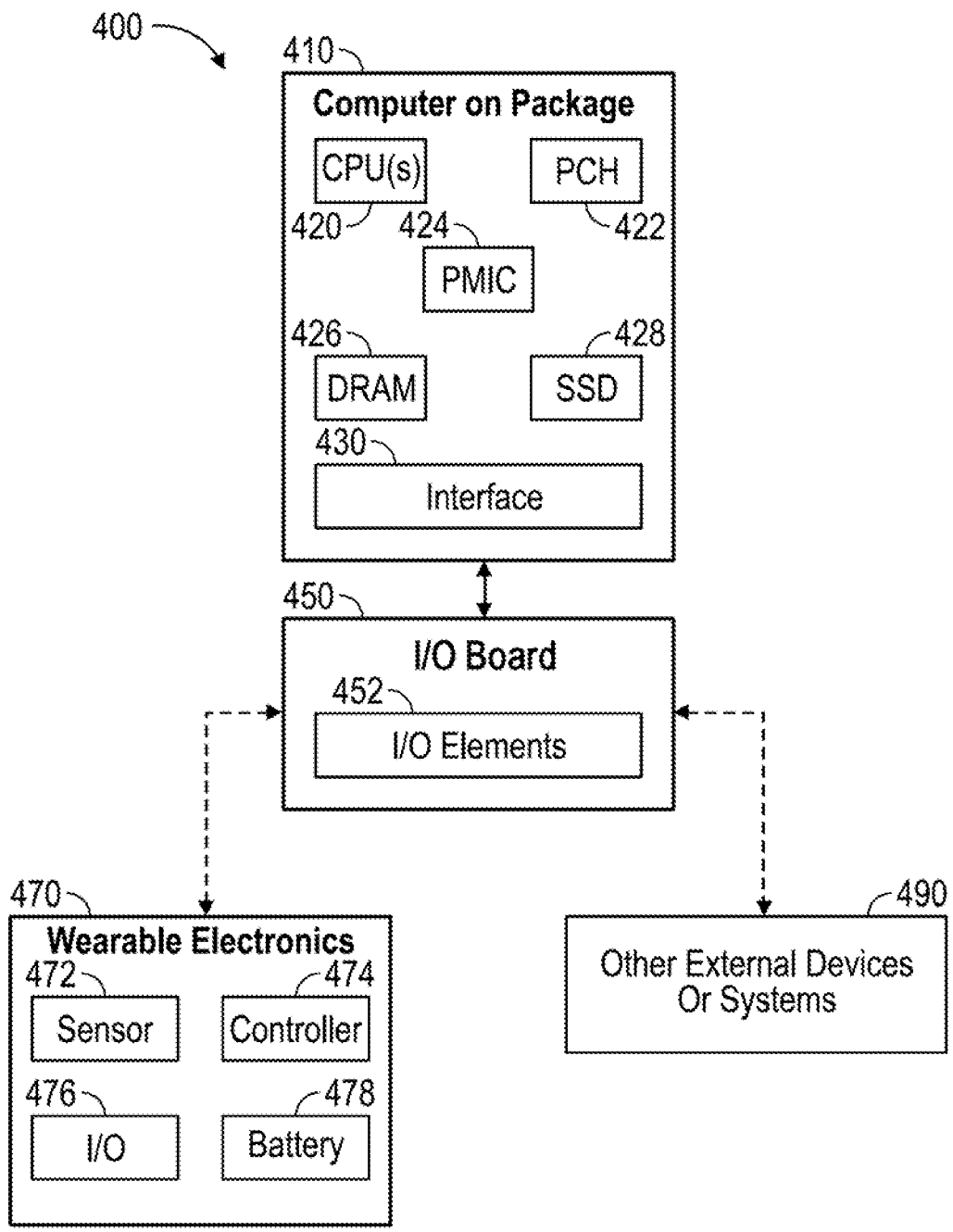
FIG. 4 illustrates components of a system including a computer on package according to an embodiment.

FIG. 4 illustrates components of a system including a computer on package according to an embodiment. For ease of illustration, FIG. 4 illustrates certain elements of a system, but is not intended to illustrate all possible components, and is not drawn to scale. As illustrated, a system 400 may include a computer on package 410 utilizing direct chip attach construction on a substrate for installation of only core elements, including silicon items CPU 420, PCH 422, and PMIC 424, as well as memory 426 and SSD storage 428. Memory may include random access memory (RAM), which includes dynamic random access memory (DRAM), requiring refreshing of memory contents, and static random access memory (SRAM), which does not require refreshing contents, but at increased cost. DRAM memory may include synchronous dynamic random access memory (SDRAM), which includes a clock signal to control signals, and extended data-out dynamic random access memory (EDO DRAM). In some embodiments, the computer on package 410 excludes I/O elements.

In some embodiments, the computer on package includes an interface 430 for coupling with an I/O board to provide I/O processes for the computer. In some embodiments, the computer on package 410 is paired with an I/O board 450, where the I/O board may include I/O elements 452 that are designed for a particular purpose or purposes, and thus may be designed and constructed with reduced waste in providing unnecessary I/O for a particular purpose. The I/O elements 452 may include, but is not limited to, one or more of a wireless transceiver and antenna (such as dipole or other antenna) to communicate with other elements. Wireless communication may include, for example, Wi-Fi, Bluetooth®, and near field communication (NFC) communications.

In some embodiments, the computer system 400 including the computer on package 410 and I/O board 450 may operate in conjunction with one or more other devices. In one example the computer system 400 may operate with wearable electronics 470 or other external linked devices, in which case the I/O board 450 may be designed with reduced elements necessary to provide communications, which may include wireless communications, with the wearable electronics and to provide communication with other external devices or systems 490 (such as a computer, network hub, or other element) as required for such wearable electronics operation. The wearable electronics 470 may include, for example, one or more sensors 472 (which may be visual sensors, audio sensors, environmental sensors, movement or location sensors, or other sensors for wearable use), a controller 474 that may provide control operations for the one or more sensors 472, I/O components 476 to communicate with at least the computer system 400, and a battery 478 or other power source as needed for the wearable electronics.

Figure 5:
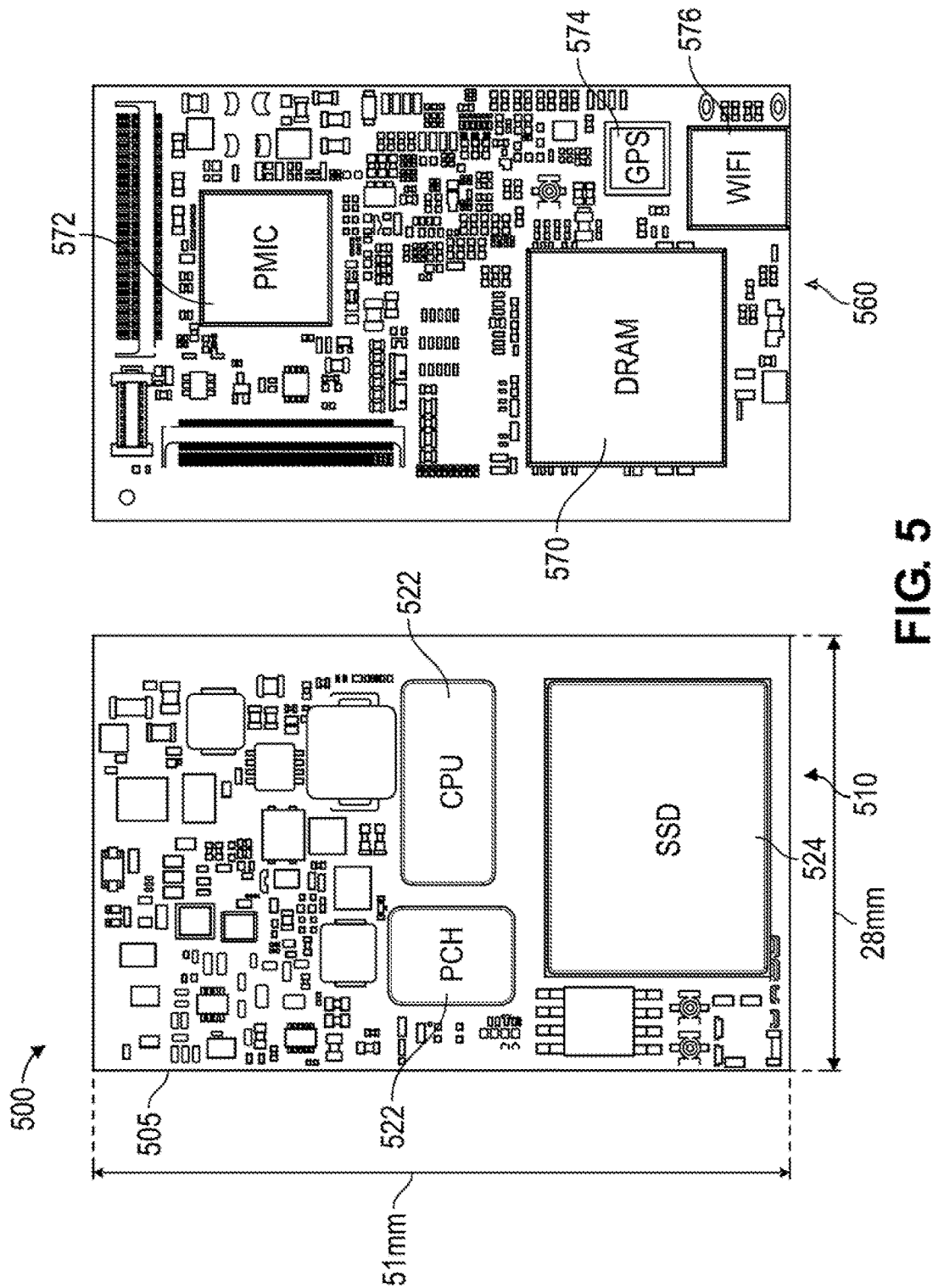
FIG. 5 is an illustration of a computer on package according to an embodiment.

FIG. 5 is an illustration of a computer on package according to an embodiment. In some embodiments, a computer on a package 500 is constructed to include only core computing elements, and to exclude I/O elements. In some embodiments, the silicon devices are installed using direct chip attachment. In some embodiments, the computer 500 is may be mated with another element to provide I/O support.

In a particular implementation, the substrate 505 of the computer on package 510 may have a size in the range of 28 mm by 51 mm, or an area of approximately 1428 mm$^2$. However, the precise physical size will vary depending on the particular implementation.

In some embodiments, a first side 510 of the substrate 505 of the computer 500 may include a CPU 520, a PCH 522, and an SSD 524. In some embodiments, a second side 560 of the substrate 505 of the computer 500 may include memory (DRAM), a PMIC, a GPS (global position satellite) unit, and a WiFi transceiver 576. However, the layout and construction illustrated in FIG. 5 is a particular implementation, and embodiments are not limited to this construction.

With DCA construction, the interconnect distances between the silicon (CPU, PCH, PMIC, and any other such semiconductor devices) and the platform devices may be significantly shortened, which in turn simplifies the power delivery network design, resulting in a reduction in the power delivery bill of material (e.g. capacitors) needed on the circuit board. On the signaling side, the overall design can be compacted significantly as a computer on package design reference is used (instead of typical platform design guide (PDG), which typically requires larger trace width and spacing). Further, length tuning for the system may be a lesser consideration for high speed interfaces (such as DDR, double data rate) because longer distances are much less of an issue in the small form factor.

In some embodiments, only core components (CPU, PCH, PMIC, RAM, storage, and other core components) are packed in the package while the large and bulky I/O connectors, which are body size limited and can't benefit significantly, from the fine design rules offered by the substrate, are placed on a separate PCB, which may be referred as the I/O board. In this manner, the core package may be reduced to a minimal size.

Figure 6:
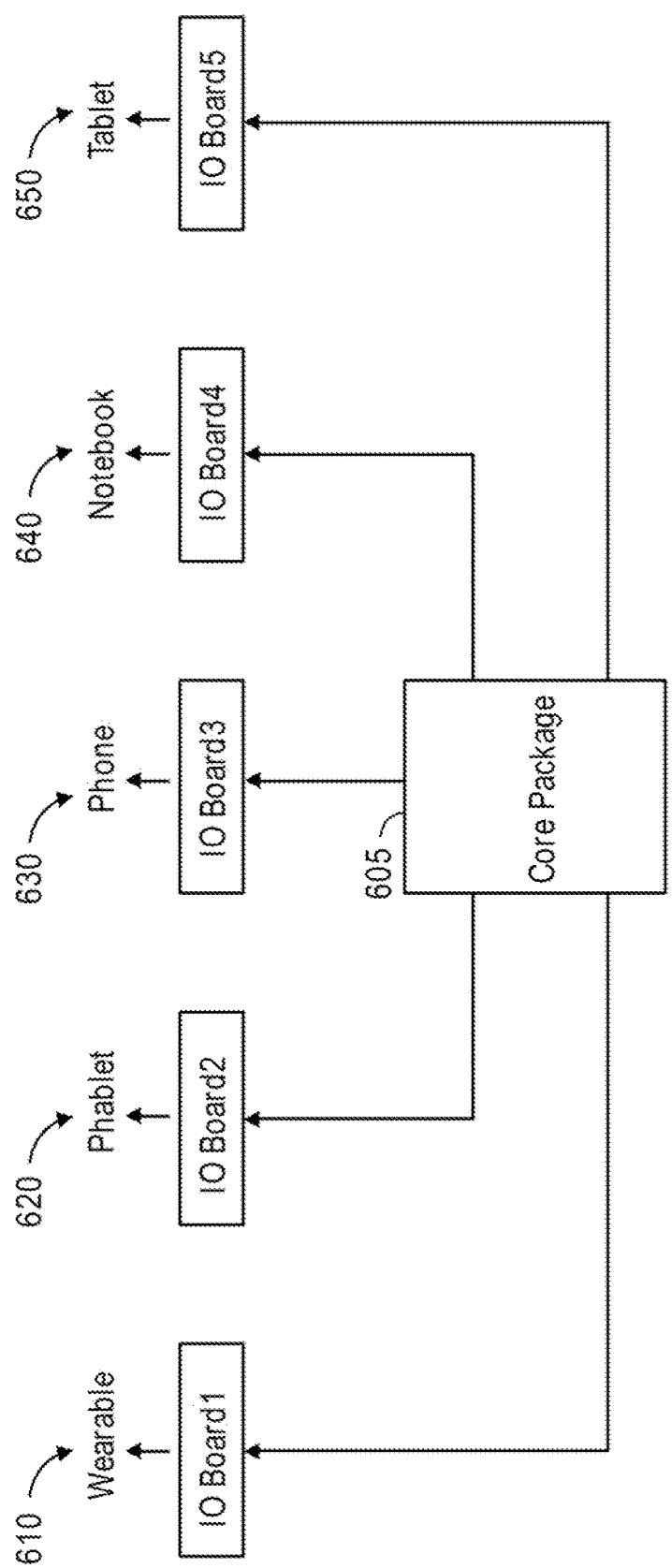
FIG. 6 is an illustration of a system including a computer on package and an I/O board according to an embodiment.

In some embodiments, the core package further enables the application of a scalable design process whereby the I/O board can be customized for various device usages. FIG. 6 is an illustration of a system including a computer on package and an I/O board according to an embodiment. In FIG. 6, a system 600 includes a core computer on package 605, wherein the computer on package 605 may be paired with one of a plurality of I/O board, and wherein each I/O board may be designed and produced for a particular purpose.

As illustrated in FIG. 6, an I/O Board1 is an I/O board for a wearable electronics device 610 (which thus may be small and limited to limited I/O capability); I/OBoard2 is an I/O board for a phablet device 620; I/OBoard3 is an I/O board for a telephone such as a smartphone 630; I/OBoard4 is an I/O board for a notebook computer 640; and I/OBoard5 is an I/O board for a tablet computer 650. While not illustrated here, the computer on package 605 is not limited to these usages and may be also be used in, for example, desktop computing or other purposes. In some embodiments, a scalable design concept provides for the core components to be packed in the computer package, while various 10 boards 610-650 are designed to pair with the core board to serve different device segments.

Figure 7:
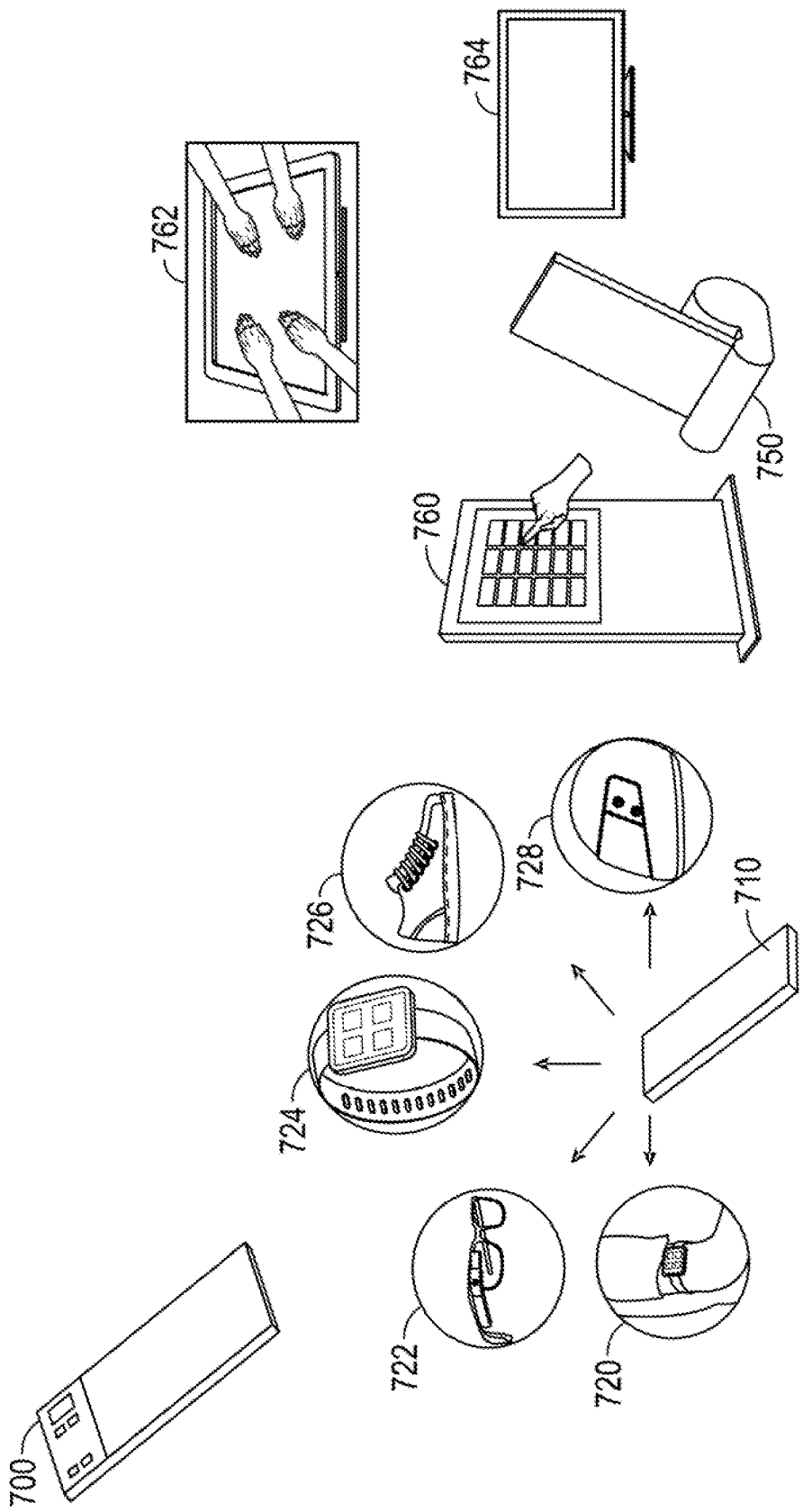
FIG. 7 is an illustration of computer system utilizing a computer on package according to an embodiment.

FIG. 7 is an illustration of computer system utilizing a computer on package according to an embodiment. In some embodiments, a computer such as a credit card size PC 700 utilizes computer on package construction to achieve a small form factor.

In some embodiments, the computer 700 may be used in a mobile operation (PC on pocket) 710, wherein the computer may be used to provide processing for one or more wearable devices or other external linked devices, including multiple simultaneous device operations. As illustrated, the external linked devices may include fitness devices 720 that track data related to physical activity; eyeglass devices 722 including devices that generate visual and audio data and provide visual and audio data to a user (wherein Google Glass is an example); a smartwatch device 724 that provides a user interface for computer operations; small sensing devices such as sensors in athletic shoes 726; and helmet sensors 728 for use in motorcycle operation and other similar usages.

In some embodiments, the computer 700 may also be used in a stationary operation 750, such as when installed in a docking station that may provide, for example, power for operation (which may allow higher performance operation), a wired interface for communication with other devices and systems, and possible fan operation to cool the computer 700 and support higher performance operation. In some embodiments, the computer 700 may operate in conjunction with multiple devices, including a kiosk computing station 760, a large touch screen operation 762, and any standard computer monitor 764.

Figure 8:
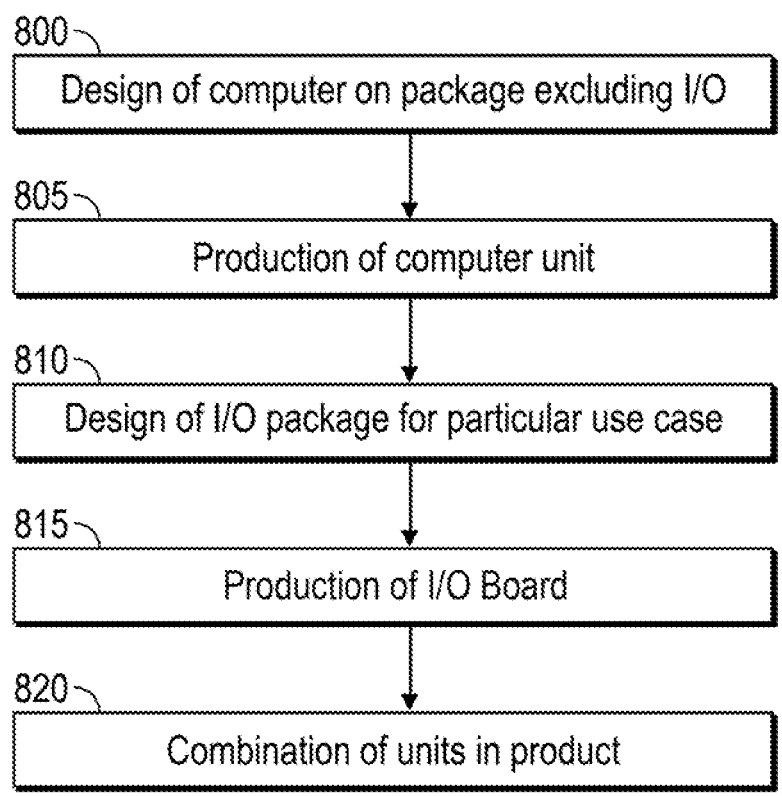
FIG. 8 is a flowchart to illustrate an apparatus design and construction process according to an embodiment.

FIG. 8 is a flowchart to illustrate an apparatus design and construction process according to an embodiment. In some embodiments, a process may include the design of a PC computer on package 800, such as the computers illustrated in FIGS. 4 and 7, wherein the computer on package includes core components directly installed on a package substrate and excludes I/O elements. The process may continue with the production of such computer unit 805.

In some embodiments, the process may include the design of an I/O board for a particular use case 810, such as, for example, the use cases illustrated in FIG. 5. In some embodiments, the design of such I/O board may be according to a particular design reference. The I/O board may then be produced 815, and the computer on package and I/O board units paired for a particular produce 820.

In the description above, for the purposes of explanation, numerous specific details are set forth in order to provide a thorough understanding of the described embodiments. It will be apparent, however, to one skilled in the art that embodiments may be practiced without some of these specific details. In other instances, well-known structures and devices are shown in block diagram form. There may be intermediate structure between illustrated components. The components described or illustrated herein may have additional inputs or outputs that are not illustrated or described.

Various embodiments may include various processes. These processes may be performed by hardware components or may be embodied in computer program or machine-executable instructions, which may be used to cause a general-purpose or special-purpose processor or logic circuits programmed with the instructions to perform the processes. Alternatively, the processes may be performed by a combination of hardware and software.

Portions of various embodiments may be provided as a computer program product, which may include a computer-readable medium having stored thereon computer program instructions, which may be used to program a computer (or other electronic devices) for execution by one or more processors to perform a process according to certain embodiments. The computer-readable medium may include, but is not limited to, magnetic disks, optical disks, compact disk read-only memory (CD-ROM), and magneto-optical disks, read-only memory (ROM), random access memory (RAM), erasable programmable read-only memory (EPROM), electrically-erasable programmable read-only memory (EEPROM), magnet or optical cards, flash memory, or other type of computer-readable medium suitable for storing electronic instructions. Moreover, embodiments may also be downloaded as a computer program product, wherein the program may be transferred from a remote computer to a requesting computer.

Many of the methods are described in their most basic form, but processes can be added to or deleted from any of the methods and information can be added or subtracted from any of the described messages without departing from the basic scope of the present embodiments. It will be apparent to those skilled in the art that many further modifications and adaptations can be made. The particular embodiments are not provided to limit the concept but to illustrate it. The scope of the embodiments is not to be determined by the specific examples provided above but only by the claims below.

If it is said that an element "A" is coupled to or with element "B," element A may be directly coupled to element B or be indirectly coupled through, for example, element C. When the specification or claims state that a component, feature, structure, process, or characteristic A "causes" a component, feature, structure, process, or characteristic B, it means that "A" is at least a partial cause of "B" but that there may also be at least one other component, feature, structure, process, or characteristic that assists in causing "B." If the specification indicates that a component, feature, structure, process, or characteristic "may", "might", or "could" be included, that particular component, feature, structure, process, or characteristic is not required to be included. If the specification or claim refers to "a" or "an" element, this does not mean there is only one of the described elements.

An embodiment is an implementation or example. Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. It should be appreciated that in the foregoing description of exemplary embodiments, various features are sometimes grouped together in a single embodiment, figure, or description thereof for the purpose of streamlining the disclosure and aiding in the understanding of one or more of the various novel aspects. This method of disclosure, however, is not to be interpreted as reflecting an intention that the claimed embodiments requires more features than are expressly recited in each claim. Rather, as the following claims reflect, novel aspects lie in less than all features of a single foregoing disclosed embodiment. Thus, the claims are hereby expressly incorporated into this description, with each claim standing on its own as a separate embodiment.

In some embodiments, a computer includes a substrate; one or more semiconductor devices, the one or more semiconductor devices being direct chip attached to the substrate, the one or more semiconductor devices including a central processing unit (CPU); and one or more additional components installed on the substrate, wherein the computer excludes I/O (input/output) components.

In some embodiments, the computer does not include a motherboard.

In some embodiments, the computer further includes an interface for coupling with an I/O board to provide I/O processes for the computer. In some embodiments, an I/O board to be coupled with the interface is structured for a particular use case.

In some embodiments, the computer is operable to provide data processing for an external device to be linked with the computer. In some embodiments, the external linked device is one of a wearable electronics device and an Internet of Things (IoT) device. In some embodiments, the external linked device is to be linked by either a wired or wireless connection.

In some embodiments, the one or more semiconductor devices include one or more of: a platform controller hub (PCH) and a power management integrated circuit (PMIC).

In some embodiments, the one or more additional components include one or more of: a memory; and a data storage device.

In some embodiments, the one or more additional components include one or more passive electronic devices. In some embodiments, the one or more passive electronic devices include one or more of a capacitor, resister, and inductor.

In some embodiments, the one or more additional components include a wirebond device. In some embodiments, the wirebond device is wirebond directly to the substrate.

In some embodiments, a computer includes a housing; a package substrate within the housing; one or more semiconductor devices, the one or more semiconductor devices being directly attached to the package substrate, the one or more semiconductor devices including a central processing unit (CPU); one or more additional components installed on the substrate; and an interface for coupling with an I/O (input-output) board to provide I/O processes for the computer.

In some embodiments, the package substrate is limited to core computing components. In some embodiments, the package substrate excludes I/O components.

In some embodiments, the I/O board is one of a plurality of I/O boards, each of the plurality of I/O boards being structured for a particular use case. In some embodiments, use cases for the plurality of I/O boards include one or more of a wearable electronics device; a phablet device; a smartphone; a notebook computer; or a tablet computer.

In some embodiments, the one or more semiconductor devices include one or more of: a platform controller hub (PCH) and a power management integrated circuit (PMIC).

In some embodiments, the one or more additional components include one or more of: a random access memory (RAM); and a solid state drive (SSD).

In some embodiments, the one or more additional components include one or more passive electronic devices.

In some embodiments, the computer is operable to provide processing for an external device to be linked with the computer. In some embodiments, the computer is to utilize one or more interfaces provided by the external linked device. In some embodiments, the computer is to operate as a computing hub for one or more external devices.

In some embodiments, a system includes: a computer on package, the computer on package including a package substrate, one or more semiconductor devices, the one or more semiconductor devices being direct chip attached to the package substrate, the one or more semiconductor devices including a central processing unit (CPU), and one or more components installed on the package substrate, the one or more components including a dynamic random access memory (DRAM) and a solid state drive (SSD); and an I/O board coupled with the computer on package, the I/O board providing I/O services for the computer on package.

In some embodiments, the I/O board is one of a plurality of I/O boards that may be installed in the system.

In some embodiments, the computer is operable to provide processing for an external device that is to be linked with the computer. In some embodiments, the external linked device is one of a wearable electronics device and an Internet of Things (IoT) device.

In some embodiments, the package substrate is limited to core computing components.

In some embodiments, the one or more semiconductor devices include one or more of a platform controller hub (PCH) and a power management integrated circuit (PMIC).

In some embodiments, the one or more additional components include one or more passive electronic devices.

What is claimed is:

1. A computer on package for a computer system comprising:
    a package including a single package substrate;
    computer components including:
        a plurality of semiconductor devices for the computer system installed on the single package substrate, the plurality of semiconductor devices including one or more silicon being direct chip attached or directly wirebonded to the single package substrate, the plurality of semiconductor devices including at least:
        a central processing unit (CPU),
        a platform controller hub (PCH), and
        a power management device, and
        a plurality of additional components installed on the single package substrate to form the computer on package and support operation of the computer system, the plurality of additional components including:
            one or more active electronic devices including a computer memory to store data for the computer system, and
            one or more passive electronic devices; and
        an interface for coupling the computer on package with an I/O (input/output) board to provide I/O processes for the computer system through the interface;
    wherein the computer on package excludes a motherboard and excludes I/O components for the computer system; and
    wherein the computer system is assembled by coupling the I/O board to the interface of the computer on package.

2. The computer on package of claim 1, wherein an I/O board to be coupled with the interface is structured for a particular use case for the computer system.

3. The computer on package of claim 1, wherein the computer is operable to provide data processing for an external device to be linked with the computer.

4. The computer on package of claim 3, wherein the external linked device is one of a wearable electronics device and an Internet of Things (IoT) device.

5. The computer on package of claim 1, wherein the power management device includes:
    a power management integrated circuit (PMIC).

6. The computer on package of claim 1, wherein the one or more active electronic devices further include
    a data storage device.

7. The computer on package of claim 1, wherein the one or more passive electronic devices include one or more capacitors, resistors, and inductors.

8. A computer apparatus for a computer system comprising:
- a housing;
- a package including a single package substrate within the housing;
- computer components including:
  - a plurality of semiconductor devices for the computer system, each of the plurality of semiconductor devices including silicon being directly attached or wirebonded to the single package substrate, the plurality of semiconductor devices including at least:
    - a central processing unit (CPU),
    - a platform control hub (PCH), and
    - a power management device, and
  - a plurality of additional components installed on the single package substrate to form a computer on package and support operation of the computer system, the plurality of additional components including:
    - one or more active electronic devices including a computer memory to store data for the computer system, and
    - one or more passive electronic devices; and
- an interface for coupling the computer apparatus with an I/O (input/output) board to provide I/O processes for the computer system through the interface;
- wherein the computer system is assembled by coupling the I/O board to the interface of the computer on package.

9. The computer apparatus of claim 8, wherein the components installed in the single package substrate are limited to core computing components for the computer system.

10. The computer apparatus of claim 8, wherein the I/O board is one of a plurality of I/O boards that are coupleable with the computer apparatus, each of the plurality of I/O boards being structured for a particular use case.

11. The computer apparatus of claim 8, wherein the power management device includes:
- a power management integrated circuit (PMIC).

12. The computer apparatus of claim 8, wherein the one or more active electronic devices further include:
- a solid state drive (SSD).

13. The computer apparatus of claim 8, wherein the one or more passive electronic devices include one or more capacitors, resistors, and inductors.

14. The computer apparatus of claim 8, wherein the computer is operable to provide processing for an external device to be linked with the computer.

15. The computer apparatus of claim 14, wherein the computer is to utilize one or more interfaces provided by the external linked device.

16. A computer system comprising:
- a computer on package, the computer on package including:
  - a package including a single package substrate;
  - computer components including:
    - a plurality of semiconductor devices, each of the plurality of semiconductor devices including silicon being direct chip attached or directly wirebonded to the single package substrate, the plurality of semiconductor devices including at least:
      - a central processing unit (CPU),
      - a platform controller hub (PCH), and
      - a power management device, and
    - a plurality of additional components installed on the single package substrate to support operation of the computer system, the plurality of additional components including:
      - a plurality of active electronic devices including a dynamic random access memory (DRAM) and a solid state drive (SSD), and
      - one or more passive electronic device; and
    - an I/O (input/output) interface; and
- an I/O board coupled with the computer on package via the I/O interface, the I/O board providing I/O services for the computer on package through the interface;
- wherein the computer on package excludes a motherboard and excludes I/O components for the computer system; and
- wherein the computer system is assembled by coupling the I/O board to the interface of the computer on package.

17. The computer system of claim 16, wherein the I/O board is one of a plurality of I/O boards that may be installed in the computer system, each of the plurality of I/O boards being structured for a particular use case.

18. The computer system of claim 16, wherein the computer system is operable to provide processing for an external device that is to be linked with the computer system.

19. The computer system of claim 18, wherein the external linked device is one of a wearable electronic device and an Internet of Things (IoT) device.

20. The computer system of claim 16, wherein the single package substrate is limited to core computing components.

21. The computer system of claim 16, wherein the power management device includes:
- a power management integrated circuit (PMIC).

22. The computer system of claim 16, wherein the one or more passive electronic devices include one or more capacitors, resistors, and inductors.

\* \* \* \* \*